United States Patent [19] [11] 3,836,409
Amelio et al. [45] Sept. 17, 1974

[54] UNIPLANAR CCD STRUCTURE AND METHOD

[75] Inventors: Gilbert F. Amelio, Saratoga; Phillip J. Salsbury, Sunnyvale, both of Calif.

[73] Assignee: Fairchild Camera and Instrument Coporation, Mountain View, Calif.

[22] Filed: Dec. 7, 1972

[21] Appl. No.: 313,011

[52] U.S. Cl. .................................. 148/187, 317/235
[51] Int. Cl. .............................................. H01l 7/44
[58] Field of Search .................. 148/187; 317/235 R

[56] References Cited

UNITED STATES PATENTS

| | | | |
|---|---|---|---|
| 3,475,234 | 10/1969 | Kerwin et al. | 148/187 |
| 3,699,646 | 10/1972 | Vadasz | 148/187 X |
| 3,711,753 | 1/1973 | Brand et al. | 317/235 R |

OTHER PUBLICATIONS

"Silicon Gate Technology", Vadasz et al., IEEE Spectrum, Oct. 1969, pp. 28–35.

*Primary Examiner*—L. Dewayne Rutledge
*Assistant Examiner*—J. M. Davis
*Attorney, Agent, or Firm*—Alan H. MacPherson; Roger S. Borovoy

[57] ABSTRACT

A CCD structure is made by forming an insulating layer over semiconductor material, forming a substantially uniform layer of polycrystalline semiconductor material over the insulating layer, and then using the polycrystalline semiconductor material during the formation of gate electrodes associated with the CCD structure and associated MOS readout circuitry to prevent the diffusion of impurities into the underlying semiconductor material.

13 Claims, 13 Drawing Figures

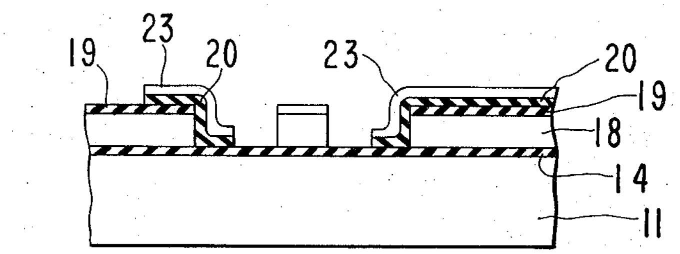
FIG. 1h
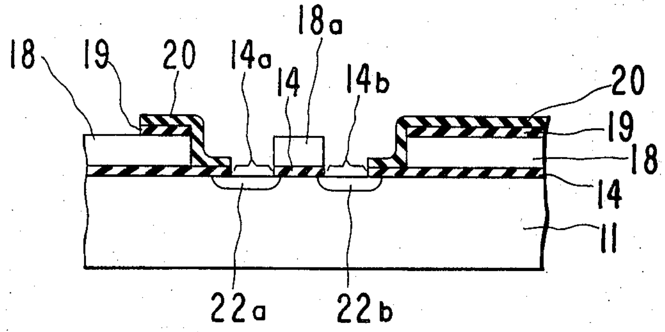
FIG. 1i
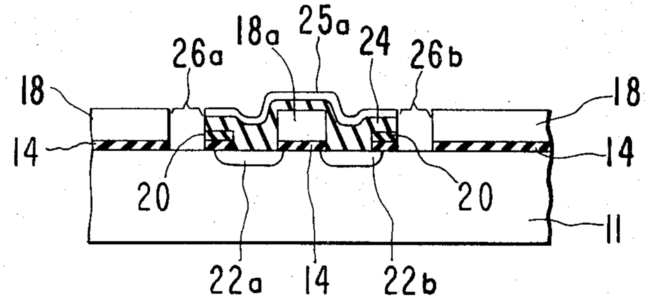
FIG. 1j
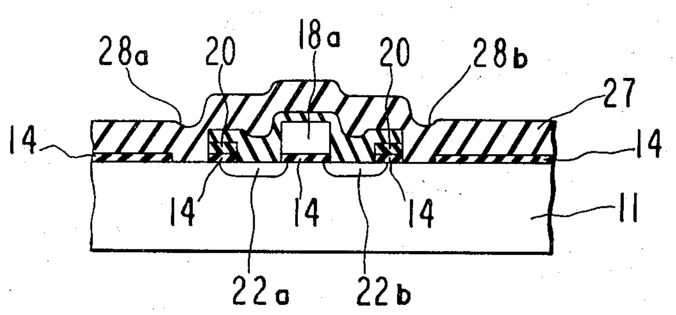
FIG. 1k
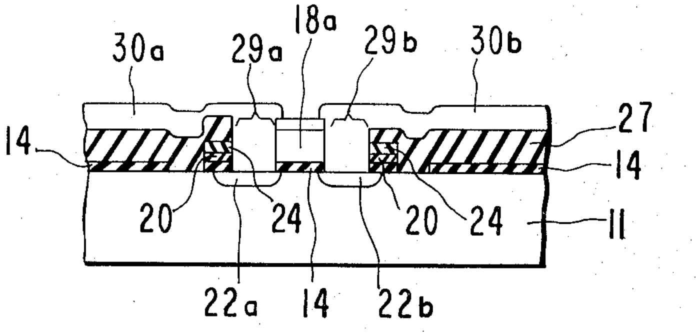
FIG. 1ℓ

UNIPLANAR CCD STRUCTURE AND METHOD

BACKGROUND OF THE INVENTION

1. Field of Invention

This invention relates to charge coupled semiconductor devices (hereinafter referred to as "CCD") and in particular to a process which permits the formation of self-aligned semiconductor devices without a field oxide, which makes possible finer photolithography over a uniformly thick insulation layer and which allows excellent definition of features of the manufactured device.

2. Prior Art

W. S. Boyle and G. E. Smith describe the basic concept of charge coupled semiconductor devices in an article published in the Apr. 19, 1970 Bell System Technical Journal, page 587 entitled "Charge Coupled Semiconductor Devices". As described by Boyle and Smith, a charge coupled device consists of a metal-insulation-semiconductor (MIS) structure in which minority carriers are stored in a "spatially defined depletion region", also called "potential well" at the surface of the semiconductor material. The charge is moved along the surface by moving the potential minimum. A paper on page 593 of the same volume of the Bell System Technical Journal by Amelio et al entitled "Experimental Verification of the Charge Coupled Device Concept" described experiments carried out to demonstrate feasibility of the charge coupled device concept.

As discussed by Boyle and Smith, charge coupled devices are potentially useful as shift registers, delay lines, and in two dimensions, as imaging devices or display devices.

In CCD structures, oftentimes MOS or bipolar transistors are also formed in semiconductor material containing the CCD components. These MOS or bipolar transistors function as part of input and/or output circuits. When MOS transistors are used in such circuits, the standard MOS processing techniques are often incompatible with the accuracies desired in the definition of the CCD components. For example, in the formation of an implanted-asymmetrical two-phase CCD, not only do the CCD gate electrodes have to be accurately defined, but in addition, regions in the underlying semiconductor material adjacent the interface of this material with an overlying insulation layer must be accurately formed using ion implantation techniques to form CCD structure capable of operating in the two-phase mode rather than the normal three-phase mode.

One reason for this difficulty lies in the fact that standard MOS processing techniques require the use of a thick field oxide to define the source and drain regions. The gate electrode is formed over a thinner gate oxide (typically around 1,500 angstroms). However, extension of a 1,500 angstrom oxide over the surface of the semiconductor material to define the source and drain regions would not produce a working MOS device due to the fact that typical P and N type impurities such as boron and phosphorus would pass through such a thin oxide layer during diffusion. Therefore, thicker oxides (on the order of 1 micron) are used for the field oxide so as to mask these impurities.

The use of such a thick oxide makes it difficult to define accurately the precise dimensions of the gate electrodes and the ion implanted regions necessary for the formation of a CCD device. For example, during certain masking steps the light used to expose photoresist visible through a mask is defocused when the mask is held above the proper object plane by a thick oxide. This defocusing significantly lowers the accuracy with which one can form the gate electrodes and other regions in a CCD device.

SUMMARY OF THE INVENTION

This invention substantially overcomes the above-described problems by using gate insulation in combination with a layer of polycrystalline semiconductor material to define accurately the components of the CCD structure. The polycrystalline semiconductor material is relatively thick compared to the gate insulation. Both the gate insulation and the polycrystalline semiconductor material are substantially uniform in thickness thereby allowing photolithographic techniques to be used with improved accuracy compared to prior art techniques in producing semiconductor CCD devices.

According to this invention, a uniform thickness polycrystalline silicon layer is formed over the field of the device. Windows are cut in this polycrystalline silicon layer and in the underlying gate oxide layer to expose regions of the underlying semiconductor material. Source and drain regions of MOS devices associated with the input-output circuitry of the charge coupled device on the chip will be formed in these regions. The uniformly thick polycrystalline silicon layer is then selectively masked with an oxide leaving exposed parts of the previously exposed regions of the underlying semiconductor material and those portions of the polycrystalline layer which will form the gate electrode for the MOS device and the gate electrodes associated with the charge coupled device to be formed on the chip. Impurities are then diffused into the exposed regions of the underlying semiconductor material to form source and drain regions of the MOS transistor and into the polycrystalline silicon to form the gate associated with the MOS transistor and into those regions of the polycrystalline silicon material which will form the gate electrodes of the CCD circuit.

After this diffusion step, the polycrystalline silicon region is masked with an oxide, typically a vapor deposited oxide, and the unwanted portions of the polycrystalline silicon covering the field of the device are removed. During diffusion, most of the polycrystalline silicon in the field was, in fact, masked with oxide so the removed field polycrystalline silicon did not contain a significant amount of dopant. Before the field polycrystalline silicon is removed, the exposed source and drain regions must be protected. This is done by placing an insulating layer, typically although not necessarily an oxide of the semiconductor material, over the source and drain regions. The oxide over the source and drain regions is then masked, typically with a photoresist, and the unmasked oxide is removed from the device thereby exposing the field polycrystalline silicon so that it can be removed by an etch.

The tolerances on both the physical dimensions of a mask and the placing of a mask on a semiconductor device are such that in order to insure that the source and drain regions are not etched by the etch which removes the field polycrystalline silicon, the oxide covering the source and drain regions must extend beyond the source and drain regions. If these source and drain regions were to extend up to and beneath the boundaries of the field polycrystalline silicon which defines the source and drain regions, rims of this field polycrystalline silicon would have to remain on the device after the remainder of the field polycrystalline silicon had been removed to protect the intersection of the source and drain pn junctions with the semiconductor surface. These rims would completely surround the source and drain regions and would make it extremely difficult to electrically contact the source and drain regions. As a feature of this invention, this problem is overcome by forming the source and drain regions within the openings formed in the polycrystalline silicon but with a significantly smaller surface area of the underlying semiconductor material exposed than the area of the openings in the polycrystalline silicon. Then, when the masking oxide layer is placed over the source and drain regions to protect them while the polycrystalline silicon is removed, errors and misalignments in the positioning of this protective oxide layer do not result in parts of this layer extending over the field polycrystalline silicon. Accordingly, all of the field polycrystalline silicon is removed and no open-circuit-inducing rims of polycrystalline silicon remain around the source and drain regions.

After the field polycrystalline silicon has been removed, additional oxide is formed on the surface of the semiconductor device. This oxide can be formed in a multitude of ways including additional thermal oxidation of the wafer or deposition. Openings are then formed in the oxide over the source and drain regions of the MOS transistors thereby allowing electrical contact to be made to the source and drain regions. The interconnect pattern in physical contact with the source and drain regions reaches the source and drain regions without having as large a step to make from the surface of the insulation layer on top of the semiconductor wafer to the source and drain regions as in the prior art. Consequently, open circuits are less frequent with the structure of this invention than with prior art structures.

The structure of this invention provides a significant improvement in the accuracy with which the photolithographic process can be applied to form the components of the CCD and associated devices.

DESCRIPTION OF THE DRAWINGS

FIGS. 1*a* through 1*l* illustrate the process of this invention by which CCD and MOS devices are formed on one chip of semiconductor material.

DETAILED DESCRIPTION

The starting point for the process of this invention is a substrate of monocrystalline semiconductor material 11 which in the preferred embodiment of this invention is silicon. It should be understood, however, that any semiconductor material which is capable of supporting surface charges of the type required in a CCD device and likewise capable of being used for the formation of MOS devices can be used with this invention. It should further be noted that the drawings used to illustrate this invention are not drawn to scale but rather are designed merely to illustrate the principals of the invention by depicting only a small portion of a semiconductor die.

Oxide layer 12 is formed on the top surface of monocrystalline silicon material 11. Typically, oxide layer 12 is 5,000 angstroms thick. Hereafter material 11 and all other materials formed on it will be collectively called wafer 10. Wafer 10 contains numerous dice which are separated from each other by techniques well known in the semiconductor arts.

Figure 1A:
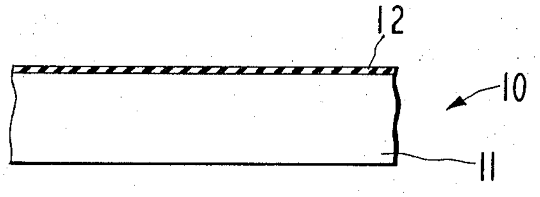
Figure 1B:
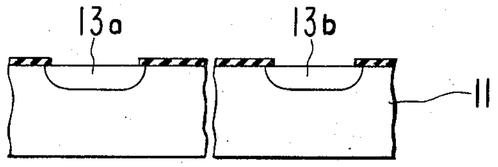

Windows are formed in the surface of oxide layer 12 to expose the surfaces of regions of material 11. An impurity such as boron is then diffused through these windows in oxide 12 to form regions of low resistivity which serve as channel stops. FIG. 1*b* shows cross-sections **13*a* and 13*b* of one such channel stop. Such channel stops reduce the effect on device performance of impurities in an overlying insulation layer such as layer 12 and also reduce the effect of surface charge on device characteristics. Typically regions 13*a*, 13*b*** have a concentration of $10^{18}$ atoms per cubic centimeter or greater.

Figure 1C:
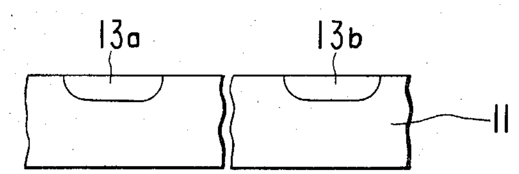

The channel stop illustrated by sections **13*a* and 13*b* (FIG. 1c) extends in a closed path around each CCD device and also around the active regions of any MOS devices to be formed on wafer 10. Thus the channel stop diffused region covers in essence the field of each die in wafer 10** wherein the field is understood to mean those portions of the die on or in which no semiconductor components are to be formed.

Figure 1D:
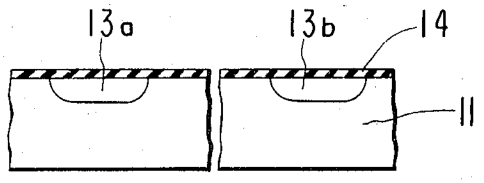

After the formation of channel stop regions 13, oxide layer 14 (FIG. 1d) is formed on the surface of the device above channel stop regions **13*a*, 13*b*. Layer 14 typically is a thermally grown oxide of approximately 1500 angstroms thickness. Portions of oxide layer 14** will serve as the gate insulation of any MOS device to be formed.

Figure 1E:
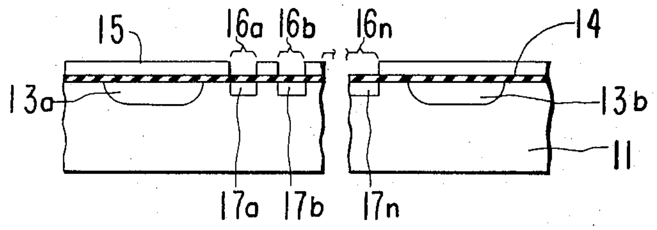
Figure 1F:
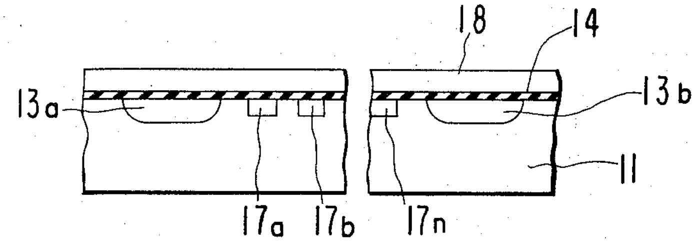

When a two-phase CCD is to operate on the chip, the next process step is to form certain barrier regions **17*a*, 17*b* . . . 17*n*, where n is an integer equal to the number of such barrier regions to be formed in any single charge coupled device. These barrier regions are formed adjacent the interface between semiconductor material 11 and oxide layer 14.** As shown in FIG. 1*e*, these regions 17 are formed by first forming a layer 15 of photoresist over the top surface of oxide 14 and then forming windows **16*a* through 16*n* in the photoresist. Wafer 10 is then ion implanted with the impurity-determining ions being captured by photoresist 15 except in those regions where 15 has been removed. In these latter regions, the impurity-determining ions travel through oxide layer 14 and lodge in regions 17*a* through 17*n* thereby forming high-impurity-concentration barrier regions. These barrier regions appropriately control the electrical potential distribution in the underlying semiconductor material to make it possible for the device to operate as a two phase CCD device. Typically the thickness of the ion implanted regions 17 is about 2,000 angstroms and the surface charge density is about $8 \times 10^{11}$ ions per square centimeter. A typical impurity to be ion implanted is boron resulting in regions 17 having a higher P type impurity concentration than does substrate 11.**

The formation of ion implanted regions 17 is followed by removal of photoresist 15 from the surface of oxide layer 14 and the formation of layer 18 of polycrystalline silicon over oxide layer 14. Polycrystalline silicon 18 is typically formed to a thickness of, for example, 5,000 angstroms by the decomposition of silane at 950°C.

Figure 1G:
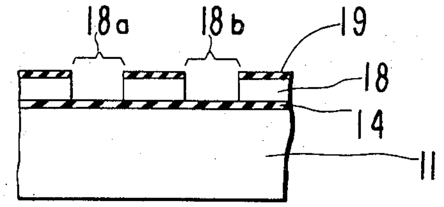

The formation of an MOS transistor and in particular the source and drain regions associated with this MOS transistor will now be described. The cross-sections of a die shown in FIGS. 1*g* through 1*e* are taken from a different portion of wafer 10 than are cross-sections shown in FIGS. 1*a* through 1*f*.

Windows 18*a* and 18*b* are next formed in polycrystalline silicon layer 18. These windows are formed by first forming a layer 19 of oxide over the top surface of polycrystalline silicon 18, removing selected regions of oxide 19 and then removing polycrystalline silicon exposed by removing these selected regions of oxide 19 down to oxide layer 14. The resulting cross-sectional structure of one to-be-formed MOS transistor is shown in FIG. 1*g*.

Windows must now be formed in oxide layer 14 to expose the top surfaces of those regions of semiconductor material 11 in which will be formed the source and drain regions of an MOS transistor. An additional layer 20 of oxide is now formed over the top surface of oxide layer 19 and the exposed surface of oxide layer 14. Oxide layer 20 is needed because oxide 14 by itself is not thick enough to mask the impurities to be diffused into material 11 to form source and drain regions.

Layer 20 is masked with a photoresist. Selected portions of oxide layer 20 are then removed by etching away those regions of layer 20 not covered with resist 23. FIG. 1*h* shows the structure at the instant the etch has removed the exposed portions of oxide layer 20 but has not touched oxide layer 19 and oxide layer 14.

The etching process continues, to produce a structure such as shown in FIG. 1*i* where the portions of oxide layers 19 and 14 not covered with resist 23 have been removed from the wafer. As shown in cross-section in FIG. 1*i*, the areas 14*a* and 14*b* of those portions of oxide layer 14 removed to expose the surfaces of underlying regions of semiconductor material 11 are much smaller than the areas of polycrystalline silicon 18 removed above this portion of oxide 14.

An impurity is next passed into semiconductor material 11. Typically this impurity is diffused from the top surface of wafer 10. In addition to forming source and drain regions 22*a* and 22*b* respectively (FIG. 1*i*), the impurity also diffuses into those portions of polycrystalline silicon 18 not covered by an oxide layer. Typically, these portions of polycrystalline silicon 18 will form the gate electrodes of an adjacent CCD structure and the gate electrode of the MOS transistor of which regions 22*a* and 22*b* are the source and drain respectively.

Polycrystalline silicon 18*a* (FIG. 1*i*) between source 22*a* and drain 22*b* has been exposed to the impurity and thus is heavily doped to form polycrystalline silicon gate electrode 18*a*. Gate oxide 14 beneath electrode 18 is about 1500 angstroms thick.

The field polycrystalline silicon, having served its purpose of providing a uniform planar surface for use in defining the limits of the gate electrodes associated with the MOS transistor and the CCD structure, must now be removed from wafer 10.

Before the field polycrystalline silicon can be removed, the exposed surfaces of source 22*a* and drain 22*b* must be protected because the same etch which removes the polycrystalline silicon will likewise attack the doped monocrystalline silicon material comprising these regions. Accordingly, oxide layer 24 (FIG. 1*j*) is formed over the surface of the device. Layer 24 is then covered with a photoresist 25 which is masked and processed to leave over oxide 24 a film 25*a* of photoresist covering those portions of oxide 24 which in turn cover source 22*a*, drain 22*b*, polycrystalline silicon gate 18*a*, the CCD gate electrodes and the undoped polycrystalline silicon between these gate electrodes. The portions of oxide layer 24 and the remaining portions of oxide layers 19 and 20 not covered by resist 25 are then removed. Removal of these oxide layers continues until polycrystalline silicon 18 or underlying silicon material 11 is exposed. At this point, all regions of polycrystalline silicon material 18 to be removed from the surface of wafer 10 have been exposed. Remaining on the wafer will be that polycrystalline silicon material comprising silicon gate 18*a* for the MOS transistor shown and the CCD gate electrodes (not shown) and any resistive polycrystalline silicon material (not shown) formed between these gate electrodes.

Polycrystalline silicon material 18 exposed by removal of the overlying oxide layer is now removed from wafer 10, typically by etching. Upon removal of this polycrystalline silicon, portions of oxide layer 14 are again exposed. It should be noted that some of the single crystal silicon material 11 directly beneath windows 26*a* and 26*b* (FIG. 1*j*) is removed while polycrystalline silicon 18 is being removed. However, these exposed regions of material 11 are small compared to the exposed portions of polycrystalline silicon 18 and the etch rate of single crystal material 11 is selectively much slower than that of the polycrystalline silicon 18. Thus little or no damage is done to the underlying single crystal semiconductor material 11.

Upon completion of selective removal of polycrystalline silicon material 18 from wafer 10, oxide 27 (FIG. 1*k*) is formed over the whole surface of wafer 10. Oxide 27 covers thermally grown oxide 14 and can be either deposited or thermally grown. In one embodiment oxide 27 was formed to a thickness of about 1,000 angstroms but oxide 27 can be any selected thickness required to yield a semiconductor device with the desired characteristics. In another embodiment this oxide was several thousand angstroms thick.

Following the formation of oxide 27 (FIG. 1*k*) windows 29*a* and 29*b* (FIG. 1*e*) are formed through oxide 27 to the top surface of source region 22*a* and drain region 22*b*, and electrodes 30*a* and 30*b* are formed in windows 29*a* and 29*b* to source region 22*a* and drain region 22*b* respectively (FIG. 1*e*).

While the CCD structure requires a channel stop, this invention advantageously turns this channel stop into use to also define the regions of the MOS transistor. In essence, the channel stop is placed beneath the field of the device around the whole semiconductor chip. Such a channel stop reduces the effects of contaminants and surface states on the device performance.

The uniform thickness of the gate oxide 14 and the polycrystalline silicon layer 18 makes it possible to define the gate electrodes of the CCD structure and the source and drain regions of the MOS transistor with very high accuracy. The flat surface of polycrystalline silicon layer 18 allows the imaging system used to expose a photoresist mask to be precisely focused with sharpness and clarity on the top of layer 18 and avoids fringing effects common in photolithigraphic processing of semiconductor devices with uneven surfaces. An additional advantage arises from the fact that even with oxide layer 27 superimposed on oxide layer 14 (FIG.

1*k*), the steps from the top of oxide 27, which must be made by contact layers 30*a* and 30*b* (FIG. 1*e*), to the exposed surfaces of source 22*a* and drain 22*b* respectively, are still smaller by several thousand angstroms than the steps required with prior art MOS transistors. Accordingly, the likelihood of open circuits at these points in the structure is greatly reduced over the similar likelihood of such open circuits in prior art structures.

Figure 2:
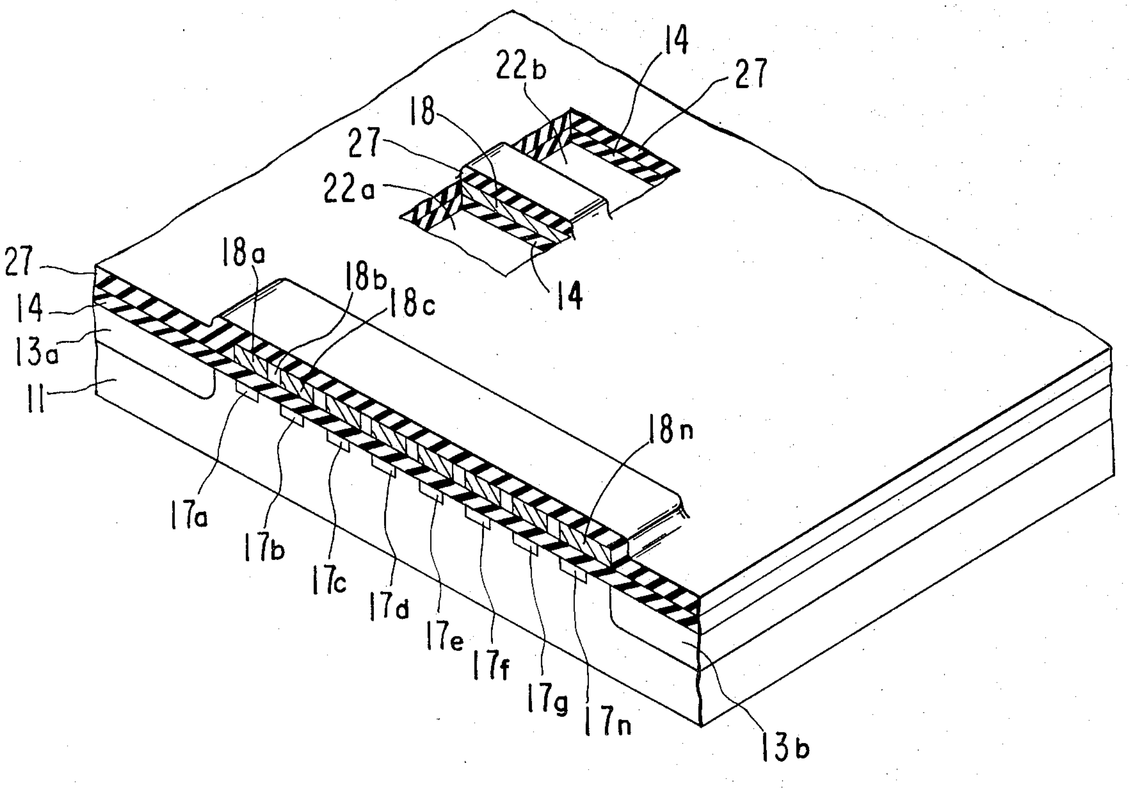
FIG. 2 shows an isometric view of one cross section of the structure of this invention.

FIG. 2 illustrates an isometric cross-sectional view of a structure constructed using the process shown in FIGS. 1*a* through 1*e*. Ion implanted regions 17*a* through 17*n* are shown formed beneath polycrystalline gate electrodes 18*a* through 18*n*. Between each adjacent gate electrode such as electrodes 18*a* and 18*c*, is a film of material, typically undoped polycrystalline silicon, which acts to reduce the potential barriers between adjacent potential wells in the underlying semiconductor material 11. Polycrystalline gate electrodes 18*a*, 18*c* . . . through 18*n* are formed on gate oxide 14. Oxide 27 overlies these gate electrodes. The MOS transistor is shown in the top center portion of the isometric drawing and comprises source region 22*a* shown opened through to the top surface of the underlying semiconductor material 11 and drain region 22*b* likewise shown open to the top surface of semiconductor material 11. Polycrystalline silicon gate electrode 18 is shown overlying gate oxide 14 and covered by oxide 27.

In an alternative embodiment of this invention, the polycrystalline silicon in the field of the device is removed before the diffusion of impurities to form source 22*a*, drain 22*b* and to dope the CCD and MOS transistor gate electrodes. This is done by removing that portion of oxide 19 covering the field of polycrystalline silicon 18 and then removing the exposed polycrystalline silicon.

Next the polycrystalline silicon 18 is masked with an oxide layer (not shown) in those regions where it is not to be doped with the impurity, i.e., in those regions comprising resistive electrodes between the gate electrodes of the CCD structure. (See FIG. 2, region 18*b*, for example). The selected impurity is then diffused into the exposed regions of polycrystalline silicon 18 to form CCD and MOS transistor gate electrodes. The oxide used to mask or protect the regions of polycrystalline silicon 18 to be left undoped is typically a vapor deposited oxide.

An advantage of this embodiment of the process is that the moat represented by indentations 28*a* and 28*b* (FIG. 1*k*) is eliminated, and one less masking step is required because the source and drain regions are defined in one masking step rather than two. The disadvantage is that the masking tolerances limit the size of the polycrystalline silicon leads on the surface of wafer 10 from contact pads to the CCD structure.

While two embodiments of this invention have been described, it should be noted that other embodiments are also capable of being formed using the principles of this invention.

What is claimed is:

1. A method of making a charge coupled device structure and an MOS transistor structure in a single piece of semiconductor material of one conductivity type, comprising the steps of:

forming a channel stop region adjacent one surface of said semiconductor material so as to form a closed path around a portion of said one surface;

forming a first layer of insulation at least over that portion of said one surface within said channel stop region;

forming a substantially uniform layer of polycrystalline silicon over said first layer of insulation;

forming a second layer of insulation over said polycrystalline silicon;

forming at least two openings in said second layer of insulation in said polycrystalline silicon to expose the surface of at least two selected regions of said first layer of insulation;

forming an opening through each of said at least two selected regions of said first layer of insulation to expose the surface of at least two selected regions of said semiconductor material, each said opening in said first layer of insulation being smaller in area than the corresponding opening in said polycrystalline silicon;

forming a plurality of openings in said second layer of insulation to expose the top surfaces of a plurality of regions of said polycrystalline silicon; and forming a selected impurity in said plurality of regions of said polycrystalline silicon and in said at least two selected regions of said semiconductor material, thereby to form a plurality of conductive regions in said polycrystalline silicon and in at least two regions of opposite conductivity type in said semiconductor material.

2. The method of claim 1 wherein the steps of forming an opening through each of said at least two regions of said first layer of insulation and of forming a plurality of openings in said second layer of insulation to expose the top surfaces of a plurality of regions of polycrystalline silicon comprises:

forming a third layer of insulation over the top surface of the second layer of insulation and the exposed surface of the first layer of insulation, said third layer and said first layer together being capable of masking impurities to be diffused into said semiconductor material;

removing portions of said third layer of insulation and said second layer of insulation to expose surfaces of said plurality of regions of said polycrystalline silicon and removing portions of said third layer of insulation and said first layer of insulation to expose the surfaces of at least two selected regions of said semiconductor material, the exposed surfaces of said at least two selected regions occupying a smaller surface area than said at least two openings in said second layer of insulation and in said polycrystalline silicon.

3. The method of claim 1 including the additional step of removing said polycrystalline silicon overlying the field of said combined charge coupled device and said MOS transistor.

4. The method of claim 3 wherein said step of removing the polycrystalline silicon overlying the field comprises the steps of:

forming a fourth layer of insulation over at least the surfaces of said at least two selected regions of said semiconductor material, said plurality of openings in said second layer of insulation, and the portions of said second layer of insulation located between said plurality of openings and removing the portions of said first, second, third and fourth layers of insulation not overlying or underlying the surfaces of said at least two selected regions of said semiconductor material, said plurality of openings in said second layer of insulation, and the portions of said second layer of insulation located between said plurality of openings until polycrystalline silicon or underlying semiconductor material is exposed; and removing the exposed polycrystalline silicon material to expose portions of the underlying first layer of insulation.

5. The method of claim 4 including the step of:

forming a fifth layer of insulation over the top surface of the structure; and forming openings in said fifth layer of insulation to expose the top surface of said at least two selected regions of said semiconductor material.

6. The method of claim 5 including the additional step of forming contacts to said at least two selected regions through said openings in said fifth layer of insulation.

7. The method of claim 1 wherein one of said plurality of regions of said polycrystalline silicon is located over said first layer of insulation between two of said at least two selected regions of said semiconductor material.

8. The method of claim 1 wherein said first layer of insulation comprises an insulating layer of uniform thickness.

9. The method of claim 1 wherein said first layer of insulation comprises silicon oxide.

10. The method of claim 1 including the additional step of forming a multiplicity of barrier regions in said semiconductor material adjacent the interface between said semiconductor material and said first layer of insulation, said multiplicity of barrier regions being formed to appropriately control the electrical potential distribution in the underlying semiconductor material as required for the operation of a two-phase charge coupled device in said semiconductor material.

11. The method of claim 10 wherein the step of forming said multiplicity of barrier regions comprises the step of forming a multiplicity of ion-implanted regions of about 2000 angstroms thickness adjacent the interface between said semiconductor material and said first layer of insulation, said barrier regions being formed with a surface charge density of about $8 \times 10^{11}$ ions per square centimeter.

12. A method for making a charge coupled device structure and an MOS transistor in a single piece of semiconductor material which comprises the following steps:

forming a channel stop region adjacent one surface of semiconductor material, said channel stop region forming a closed path around the surface of a portion of said semiconductor material in which is to be formed a charge coupled device and an MOS transistor, at least part of the semiconductor material outside of said portion comprising the field of said structure;

forming an insulating layer over said one surface of said semiconductor material;

forming a uniform layer of polycrystalline semiconductor material over said insulating layer;

removing the polycrystalline semiconductor material formed over the field of said structure and over selected regions of said insulating layer to leave on said insulating layer selected shapes of polycrystalline semiconductor material;

forming openings through said selected regions of said insulating layer to expose the surfaces of selected regions of said semiconductor material, said openings being formed adjacent selected portions of said polycrystalline semiconductor material left on said insulating layer and each opening through said insulating layer being smaller in area than the corresponding opening through said polycrystalline semiconductor material;

forming a second insulating layer over said polycrystalline semiconductor material leaving exposed the surfaces of a plurality of regions of said polycrystalline semiconductor material; and forming in said regions of semiconductor material the surfaces of which are exposed by said openings, regions of a conductivity type opposite to the conductivity type of said semiconductor material and simultaneously forming in said plurality of regions of polycrystalline semiconductor material a plurality of conductive regions of said opposite conductivity type.

13. The method of claim 1 wherein said semiconductor material is silicon.

* * * * *

UNITED STATES PATENT OFFICE
CERTIFICATE OF CORRECTION

Patent No. 3,836,409 Dated September 17, 1974

Inventor(s) Gilbert F. Amelio et al.

It is certified that error appears in the above-identified patent and that said Letters Patent are hereby corrected as shown below:

Column 8, line 11, after "insulation" insert -- and --.

Signed and sealed this 26th day of November 1974.

(SEAL)
Attest:

McCOY M. GIBSON JR.
Attesting Officer

C. MARSHALL DANN
Commissioner of Patents